United States Patent
Kalyanam et al.

(10) Patent No.: US 11,586,272 B2
(45) Date of Patent: Feb. 21, 2023

(54) POWER CONTROL BASED ON PERFORMANCE MODIFICATION THROUGH PULSE MODULATION

(71) Applicant: QUALCOMM Incorporated, San Diego, CA (US)

(72) Inventors: Vijay Kiran Kalyanam, Austin, TX (US); Eric Wayne Mahurin, Austin, TX (US)

(73) Assignee: Qualcomm Incorporated, San Diego, CA (US)

( * ) Notice: Subject to any disclaimer, the term of this patent is extended or adjusted under 35 U.S.C. 154(b) by 574 days.

(21) Appl. No.: 16/669,898

(22) Filed: Oct. 31, 2019

(65) Prior Publication Data

US 2021/0096635 A1   Apr. 1, 2021

Related U.S. Application Data

(60) Provisional application No. 62/907,208, filed on Sep. 27, 2019.

(51) Int. Cl.
| | |
|---|---|
| G06F 1/32 | (2019.01) |
| H03K 5/01 | (2006.01) |
| G06F 7/58 | (2006.01) |
| G06F 1/3287 | (2019.01) |

(52) U.S. Cl.
CPC ............ *G06F 1/3287* (2013.01); *H03K 5/01* (2013.01); *G06F 7/588* (2013.01)

(58) Field of Classification Search
CPC .......... G06F 1/3287; G06F 7/588; H03K 5/01
See application file for complete search history.

(56) References Cited

U.S. PATENT DOCUMENTS

| | | | | |
|---|---|---|---|---|
| 6,304,978 B1* | 10/2001 | Horigan | ................... | G06F 1/26 |
| | | | | 713/340 |
| 6,564,328 B1* | 5/2003 | Grochowski | ......... | G06F 9/3836 |
| | | | | 713/320 |
| 2016/0378172 A1* | 12/2016 | Alexander | ............ | G06F 1/3228 |
| | | | | 713/320 |
| 2019/0068214 A1* | 2/2019 | Dewan | .................. | H03M 3/322 |

* cited by examiner

*Primary Examiner* — Stefan Stoynov
(74) *Attorney, Agent, or Firm* — Withrow & Terranova, PLLC

(57) ABSTRACT

Systems and methods for power control based on performance modification through pulse modulation include an integrated circuit (IC) that may evaluate certain limit conditions within a computing device and compare the limit conditions to corresponding predefined thresholds. When a given predefined threshold is exceeded, an overage signal may be sent to a limits management circuit within the initial IC or another IC. The limits management circuit may generate a single-bit throttle signal through a pulse modulation circuit. The single-bit throttle signal may modify internal processing of an associated processor, which in turn changes power consumption.

30 Claims, 11 Drawing Sheets

POWER CONTROL BASED ON PERFORMANCE MODIFICATION THROUGH PULSE MODULATION

PRIORITY APPLICATION

The present application claims priority to U.S. Provisional Patent Application Ser. No. 62/907,208, filed Sep. 27, 2019 and entitled "POWER CONTROL BASED ON PERFORMANCE MODIFICATION THROUGH PULSE MODULATION," the contents of which is incorporated herein by reference in its entirety.

BACKGROUND

I. Field of the Disclosure

The technology of the disclosure relates generally to controlling power consumption by an integrated circuit (IC) in a computing device.

II. Background

Computing devices have become increasingly popular in part due to ever increasing functionality. Such increased functionality comes from increasingly, powerful integrated circuits (ICs) having increasingly powerful processing capabilities. These ICs operate at increasingly high frequencies with more internal transistors, which in turn, consume more power than earlier ICs.

An additional reason for increased popularity of computing devices is a growth in the availability of mobile computing devices. Such mobile computing devices typically rely on a battery for power. Batteries effectively have maximum current values that can be provided to the ICs in the mobile computing devices. Excess current levels may result in undesired thermal activity in the computing device.

While existing computing devices have struck a balance that allows desired performance without compromising heat dissipation or performance, new generations of ICs are imposing ever greater demands on the power control circuits. Traditionally, processing system hardware or software is usually constrained by limiting clock frequency and/or operating at lower voltage modes. Both of these techniques may result in performance loss including unacceptable latency. Accordingly, there is room for r power management methods that result in power demand reduction.

SUMMARY OF THE DISCLOSURE

Aspects disclosed in the detailed description include systems and methods for power control based on performance modification through pulse modulation. In particular, an integrated circuit (IC) may evaluate certain limit conditions within a computing device and compare the limit conditions to corresponding predefined thresholds. When a given predefined threshold is exceeded, an overage signal may be sent to a limits management circuit within the initial IC or another IC. The limits management circuit may generate a single-bit throttle signal through a pulse modulation circuit. The single-bit throttle signal may modify internal processing of an associated processor, which in turn changes power consumption.

In this regard, in one aspect, an IC configured to be placed in a computing device is disclosed. The IC includes a limits management circuit. The limits management circuit includes a pulse modulator circuit configured to convert a multi-bit overage signal to a single-bit throttle signal. The limits management circuit also includes an output port configured to output the single-bit throttle signal. The IC also includes a processing circuit coupled to the output port and comprising a scheduler circuit configured to modify behavior of the processing circuit responsive to the single-bit throttle signal. The scheduler circuit is configured to change performance based on the single-hit throttle signal.

In another aspect, a computing device is disclosed. The computing device includes a first IC. The first IC includes a limits management circuit. The limits management circuit includes a pulse modulator circuit configured to convert a multi-bit overage signal to a single-bit throttle signal. The limits management circuit also includes an output port configured to output the single-bit throttle signal. The computing device also includes a processing circuit coupled to the output port and comprising a scheduler circuit configured to modify behavior of the processing circuit responsive to the single-bit throttle signal. The scheduler circuit is configured to change performance of the processing circuit. The computing device also includes a second IC. The second IC includes memory configured to contain an over-limits table configured to contain configurable thresholds used to generate the multi-bit overage signal. The second IC also includes a summation circuit configured to receive information indicative of per-device current consumption and sum the information. The summation circuit is further configured to store the summed information in the over-limits table. The computing device also includes one or more current sensors configured to provide a respective per-device current consumption signal to the summation circuit.

In another aspect, an IC configured to be placed in a computing device is disclosed. The IC includes a limits management circuit. The limits management circuit includes an input port configured to receive a multi-bit overage signal. The limits management circuit also includes a modulator coupled to the input port and configured to create a pulse modulated (PM) single-bit throttle signal. The limits management circuit also includes an output port configured to output the PM single-bit throttle signal. The IC also includes a processing circuit configured to receive the PM single-bit throttle signal and stall operation based on the PM single-bit throttle signal.

In another aspect, a computing device is disclosed. The computing device includes a system network. The computing device also includes a voltage supply rail. The computing device also includes a device coupled to the system network and the voltage supply rail. The computing device also includes a battery coupled to the voltage supply rail. The computing device also includes a power management integrated circuit (PMIC) coupled to the battery, the system network, and the voltage supply rail. The computing device also includes a processor coupled to the system network and the voltage supply rail. The processor includes a limits management circuit. The limits management circuit includes an input port configured to receive a multi-bit overage signal. The limits management circuit also includes a modulator coupled to the input port and configured to create a PM single-bit throttle signal. The limits management circuit also includes an output port configured to output the PM single-bit throttle signal. The processor also includes a processing circuit configured to receive the PM single-bit throttle signal and stall operation based on the PM single-bit throttle signal.

In another aspect, an IC configured to be placed in a computing device is disclosed. The computing device includes a limits management circuit. The limits management circuit is configured to pulse modulate a signal indicative of over-limit levels to form a single-bit throttle signal. The limits management circuit is also configured to control performance of an associated processing circuit with the single-bit throttle signal.

In another aspect, a method for modifying performance of an IC is disclosed. The method includes receiving a multi-bit overage signal indicative of over-limit levels within a computing device. The method also includes pulse modulating the multi-bit overage signal to a single-bit throttle signal. The method also includes controlling a processing circuit in the IC to change performance of the processing circuit with the single-bit throttle signal.

DETAILED DESCRIPTION

Figure 1A:
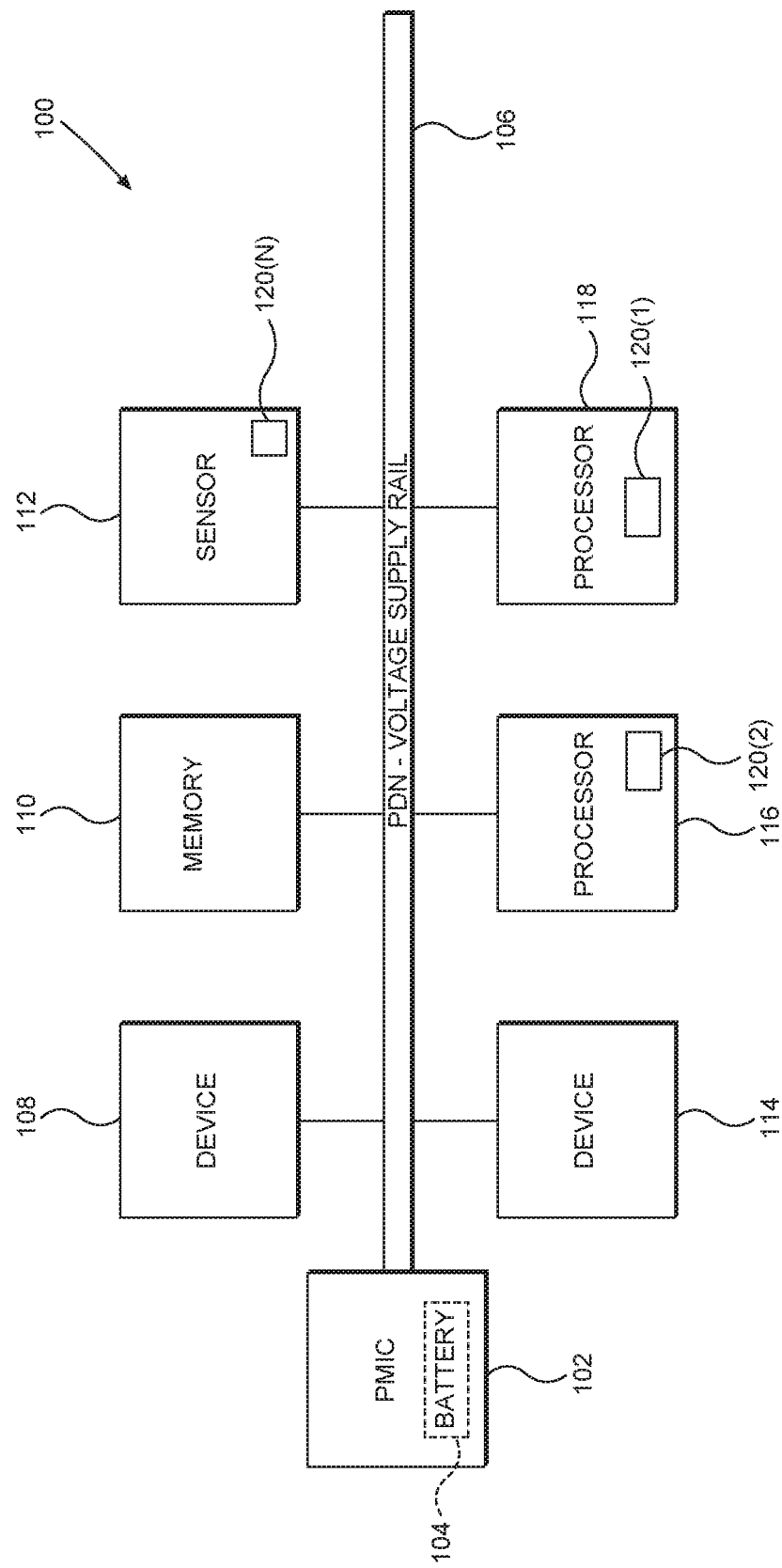
FIG. 1A is a block diagram of an exemplary computing device with a power delivery network (PDN) voltage supply rail providing power to various processors, devices, and integrated circuits (ICs) in the computing device.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for power control based on performance modification through pulse modulation. In particular, an integrated circuit (IC) may evaluate certain limit conditions within a computing device and compare the limit conditions to corresponding predefined thresholds. When a given predefined threshold is exceeded, an overage signal may be sent to a limits management circuit within the initial IC or another IC. The limits management circuit may generate a single-bit throttle signal through a pulse modulation circuit. The single-bit throttle signal may modify internal processing of an associated processor, which in turn changes power consumption.

Figure 1B:
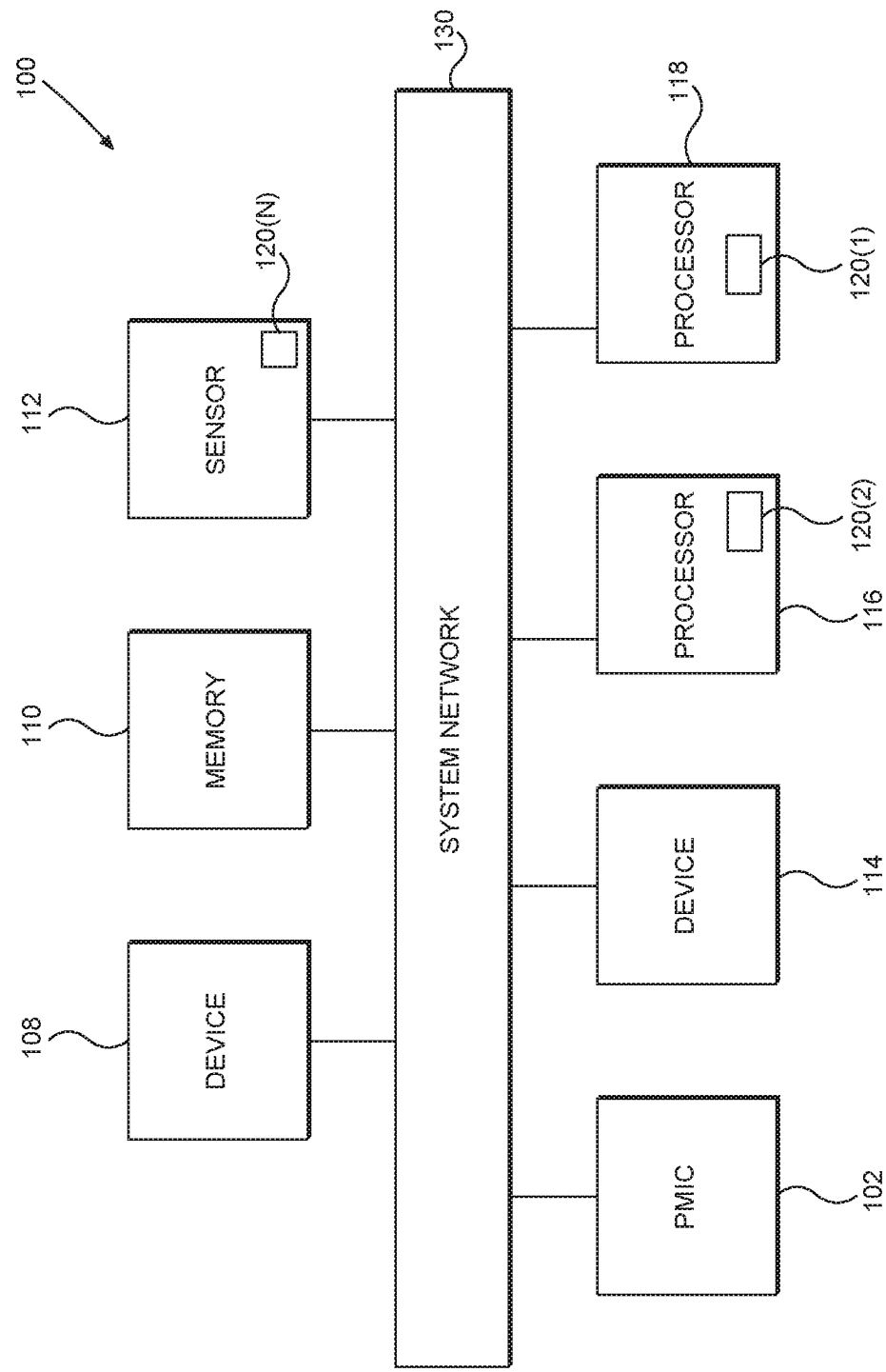
FIG. 1B is a block diagram of the computing device of FIG. 1A with a system network communicatively coupling the various processors, devices, and ICs in the computing device.

Before addressing particular aspects of the present disclosure, a brief overview of the architecture of a computing device that may benefit from the present disclosure is provided with reference to FIGS. 1A and 1B. A discussion of particular features of the present disclosure begins below with reference to FIG. 2.

In this regard, FIG. 1A is block diagram of a computing device 100 having power control through performance modification circuitry according to an exemplary aspect of the present disclosure contained therein. In particular, the computing device 100 may be a mobile computing device that includes a power management IC (PMIC) 102. Alternatively, the computing device 100 may be a desktop or server type computing device without departing from the scope of the present disclosure. The PMIC 102 may contain a battery 104. Alternatively, the battery 104 may be external (not shown) to the PMIC 102. The PMIC 102 controls a voltage supply rail 106 that is part of a power delivery network (PDN) and provides power to various ICs within the computing device 100 such as a first device 108, which may be a system on a chip (SOC), a memory 110, which may be a double data rate (DDR) random access memory (RAM) or the like, a sensor 112, which may be a sensor that measures temperature or other thermal value, a second device 114, which may be a modem, a processor 116, which may be an audio codec, a digital signal processor (DSP), or the like, and/or a second processor 118, which may be a compute DSP (CDSP). In an exemplary aspect, the voltage supply rail 106 may provide one volt (1 V), In another exemplary aspect, not illustrated, the PDN may include multiple voltage supply rails 106 potentially providing different voltage levels (e.g., 0.5 V, 1 V, and 1.5 V), It should be appreciated that there may be an effective maximum current for a given voltage on the voltage supply rail 106. In an exemplary aspect, the effective maximum current may be about eight amps (8 A), although different voltages may have different maximum currents and 8 A is merely exemplary. As used herein, "about" means within 5% of the base value.

When current is drawn in excess of the maximum current, the voltage supply of the PDN may droop, and the PMIC 102 or battery 104 may not able to sustain the peak current as it exceeds PMIC 102 or battery 104 capacity. Further, when current is drawn in excess of the maximum current, heat may be generated within the computing device 100 that may exceed conventional heat dissipation processes. Similarly, when current is drawn for extended periods at (or near) the maximum current, heat may be generated that may exceed conventional heat dissipation processes, which may cause thermal runaway. This generated heat may change leakage current, or otherwise change a performance parameter of the computing device 100.

Even when excess heat is not generated, when there is a sustained supply of high peak current, the PMIC 102 may burn out or may be forced to limit current provided to ICs on the voltage supply rail 106. Traditional processes to prevent runaway or current limits include limiting a clock frequency or operating at lower voltages. These processes can result in performance loss or impact latency.

One example of such performance loss may occur in situations where processors that are multi-threaded or systems that integrate multiple processors access a shared resource through a time sharing or time multiplexing process. When pipeline stalls are applied, there may be starvation and/or resource hogging issues. That is, a shared resource access pattern can potentially cause hogging of resources such as threads resulting in Quality of Service (QoS) issues. Thus, it has been noted that performance and/or power control through pipeline stalls may create hogging and starvation issues.

Exemplary aspects of the present disclosure provide a limits management hardware (LMH) solution to avoid thermal runaway or violation of current demand in the system. In particular, the present disclosure provides a pulse modulation solution that converts a multi-bit over-the-limit level signal to a single-bit indicator or throttle signal to control processing circuitry performance and processing circuitry power consumption. Additionally, this solution may have an optional random factor injected into the pulse modulation to prevent hogging and starvation in multi-threaded processors or multiple processor systems.

Exemplary aspects of the present disclosure provide one or more limits management circuits 120(1)-120(N) (generically referred to as a limits management circuit 120), which may be used to throttle, stall, inject a no-operation (NOP) code, or clock gate activity in an IC by stalling or clock gating processing as explained in greater detail below. It should be appreciated that not every IC includes a respective limits management circuit 120.

In addition to the voltage supply rail 106, the various ICs may be communicatively connected or coupled through a system bus or system network 130 as illustrated in FIG. 1B.

A preselected limit condition or set of limit conditions (such as (I) sum of current demands across all devices sharing the voltage supply of the voltage supply rail; (II) current consumption within a computing device; and/or (III) temperature of a processing device or its system) are each compared to corresponding configurable thresholds of each of the limit conditions. If the comparison shows that a value exceeds a threshold, a multi-bit value corresponding to an overage signal is stored in an over-limits table after accounting for a new target performance and power. From the over-limits table, the multi-bit overage signal may be sent to an IC in the computing device 100 and particularly to the limits management circuit 120. In a first exemplary aspect, the multi-bit overage signal is sent from an IC containing the over-limits table (e.g., the first device 108) to a second IC (e.g., the second processor 118). In a second exemplary aspect, the over-limits table is present in the device whose performance is being modified.

In use, the first device 108 collects information about current usage and/or thermal conditions and passes that information in the form of the overage signal to the limits management circuit 120, which then throttles a processor or processing circuits within the IC. The throttling may be done by stalling or unstalling an instruction transaction or appropriate clock gating. Further, the throttling may have a random element to time share fairly resources within the processor. In practice, the randomization takes place in an integrator or accumulator loop and has a mean of zero (0) to assure a non-biased randomization. If randomization occurs elsewhere, it may be biased or non-biased.

Figure 2:
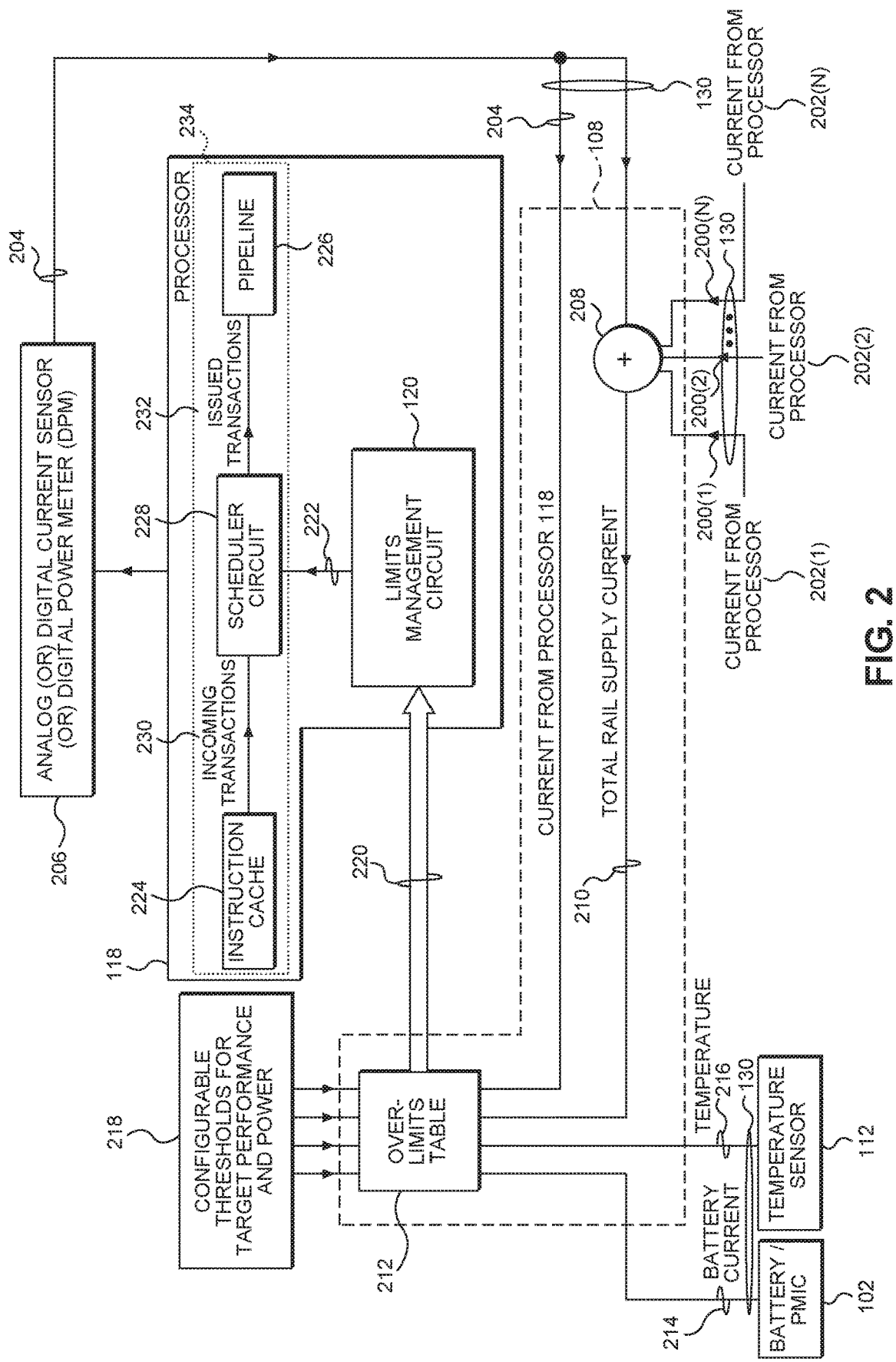
FIG. 2 is a block diagram of signals passing from various ICs of the computing device of FIGS. 1A and 1B over the system network to a limits management circuit within an IC for controlling performance and varying power use by the IC.

In this regard, FIG. 2 illustrates a modified view of the computing device 100. In particular, a first processor such as the first device 108 receives current signals 200(1)-200(N) from various processors and ICs 202(1)-202(N) (e.g., memory 110, sensor 112, device 114, and/or processor 116) as well as a current signal 204 from the processor 118. Current may be measured directly using an analog or digital current sensor or may be derived from a digital power meter (DPM). A DPM may generate a dot-product using processor events and associated power-weights for each event. For the processor 118, the current sensor may be internal (not shown) or an external sensor such as current sensor 206. The first device 108 uses a summation circuit 208 to sum the current signals 200(1)-200(N) with the current signal 204 to determine a total rail supply current value 210. The current signal 204 and the total rail supply current value 210 are provided to an over-limits table 212 within the first device 108. Additionally, the over-limits table 212 may receive signals reflecting a battery current level (e.g., signal 214) from the PMIC 102 and/or a temperature level (e.g., signal 216) from a temperature sensor 112. The signals 214, 216, and other signals may pass to the over-limits table 212 through the system network 130.

With continued reference to FIG. 2, the over-limits table 212 may also receive one or more configurable thresholds 218. These configurable thresholds 218 may be provided at creation, system initialization, power reboot, or the like. The first device 108 may use the over-limits table 212 and the configurable thresholds 218 to determine if the current levels (either summed such as the total rail supply current value 210 or an individual current level such as the current signal 204), temperature, battery current, or other limit condition exceeds a desired level as defined by the configurable thresholds 218. If the first device 108 determines that there is an overage, a multi-bit value is generated indicating generally a magnitude of the overage (e.g., how much overage there is). In an exemplary aspect, this multi-bit value ranges from zero (0) to 255 (i.e., $2^8$ possible values to represent an eight-bit value), where zero represents no overage, although any range of values may be used as needed or desired. The over-limits table 212 may output this multi-bit value as a plurality of overage bits or multi-bit overage signal 220 representing over-limits data for a target performance and power. The multi-bit overage signal 220 is provided to a limits management circuit 120 within the processor 118. The limits management circuit 120 converts the multi-bit overage signal 220 to a single-bit throttle signal 222. In an exemplary aspect, the limits management circuit 120 is a delta-sigma modulator, and as noted, may inject a random value as explained in greater detail below.

With continued reference to FIG. 2, the processor 118 may include a memory structure such as an instruction cache (I-cache) 224 in which instructions can be stored and from which instructions can be retrieved. As used herein, "transactions" is used to refer to one or more instructions which can be processed by an instruction pipeline such as pipeline 226. A scheduler circuit 228 is configured to receive instructions or incoming transactions 230 from the I-cache 224 and provide issued transactions 232 to be processed in the pipeline 226. The issued transactions 232 provided to the pipeline 226 and other activity in the processor 118 is monitored for current/power usage using a DPM or current sensor 206. Deviations may take place in the implementation or execution of the issued transactions 232 in the pipeline 226, The pipeline 226 can include different functional blocks for executing the issued transactions 232 in one or more clock cycles.

As noted above, the limits management circuit 120 generates a single-bit throttle signal 222. In an exemplary aspect, the single-bit throttle signal 222 stalls issued transactions. In an alternate aspect, not illustrated, the single-bit throttle signal 222 acts as a clock gate signal that affects all the clocked blocks of the processor 118 as is well understood. In another alternate aspect, not illustrated, the single-bit throttle signal 222 could inject NOPs into the processor 118.

Figure 3:
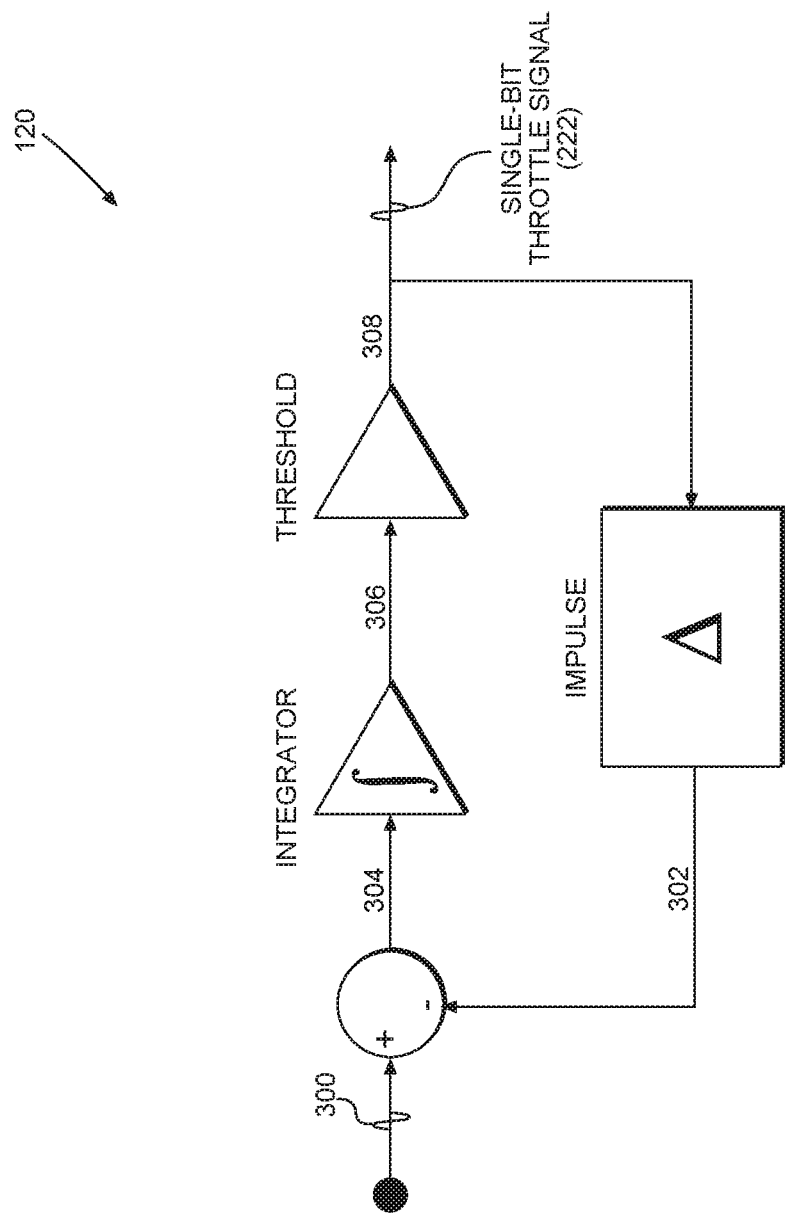
FIG. 3 is a stylized representation of an exemplary aspect of the pulse modulation process used by exemplary aspects of the present disclosure to provide a single-bit throttle signal to modify internal processing, which in turn may change power consumption by the IC.

FIG. 3 illustrates a stylized representation of a pulse modulation process used by exemplary aspects of a limits management circuit 120 according to the present disclosure. In particular, the pulse modulation process may be based on a delta-sigma modulator. The "delta" part is formed by the difference or subtraction from an input 300 (corresponding to the multi-bit overage signal 220 of FIG. 2) of an impulse value 302. That difference value 304 is integrated into value 306, which is in effect an error signal and compared to a reference using threshold circuitry to arrive at value 308, which is provided to an impulse function and output as the single-bit throttle signal 222. The value 306 is compared to a reference to determine if the error exceeds the reference. The value 308 is provided to the impulse function which outputs the impulse value, which may be either a zero or a maximum value to be subtracted from the input 300. While FIG. 3 does not show randomization, it should be appreciated that randomization may be used at various locations to prevent starvation and resource monopolization. Randomization as applied to the limits management circuit 120 is explored in greater detail below with reference to FIGS. 6A-6C.

By stalling transactions in processing circuitry 234 (sometimes referred to as a processing core) of the processor 118 with the scheduler circuit 228, injecting NOPs in the processor 118, or otherwise clock gating the transactions in the processor 118, a demand for current falls, current consumption falls, heat generation due to processor activity is reduced, processor temperatures fall, and current overages are avoided. The more frequently the power-gating indicator in the form of the single-bit throttle signal 222 is generated, the more the performance is degraded, but also the more the power demand and processor heat/temperature is reduced. Conversely, a reduction in generation of the single-bit throttle signal 222 increases performance, which has a corresponding increase in power consumption.

Figure 4:
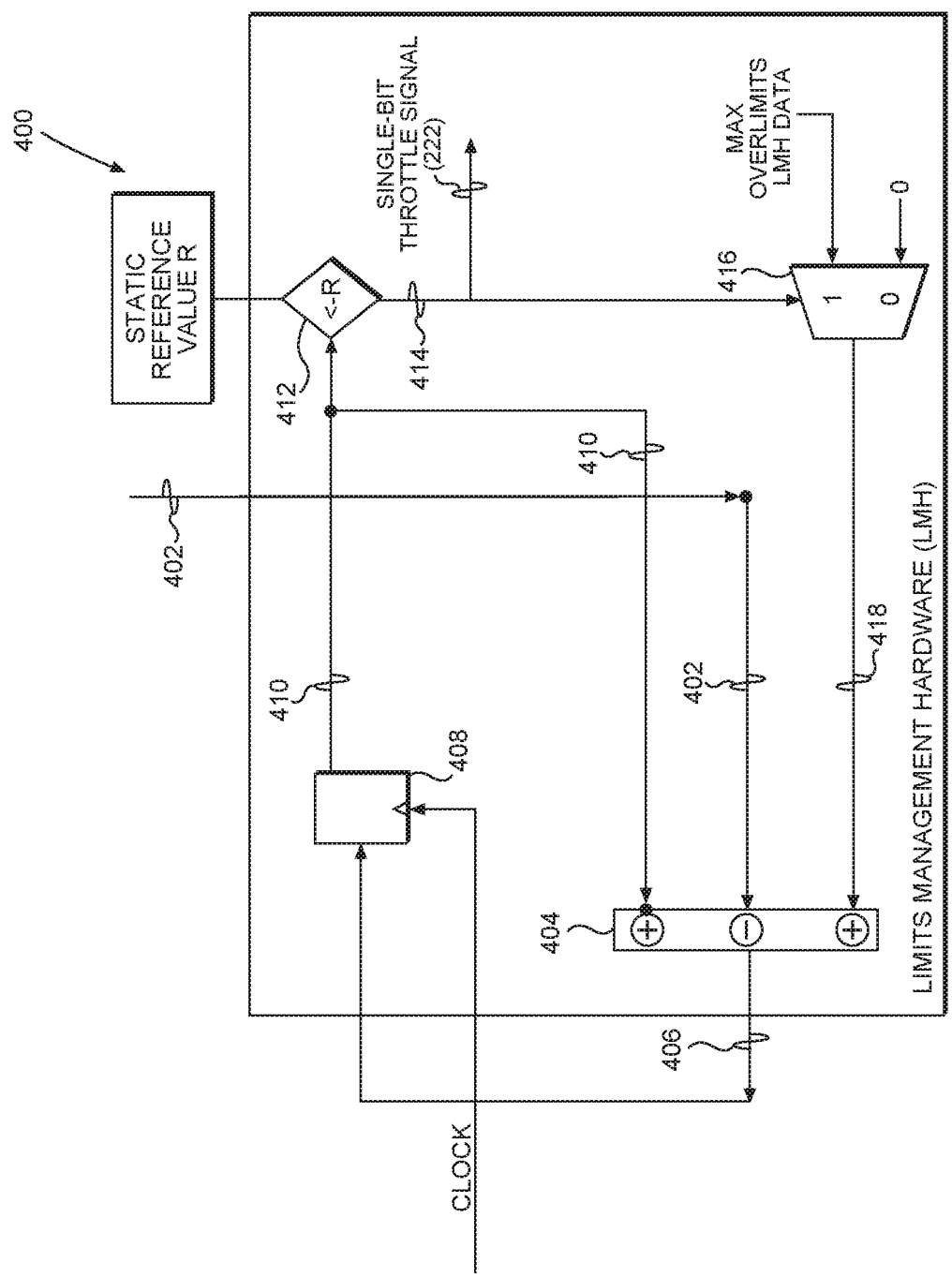
FIG. 4 is a block diagram of pulse modulation circuitry implemented with a delta-sigma modulator to create a single-bit throttle signal according to exemplary aspects of the present disclosure.

FIG. 4 is a block diagram of an exemplary limits management circuit 400 corresponding to limits management circuit 120 that implements the abstract system of FIG. 3. In the limits management circuit 400, an eight-bit value 402 (analogous to input 300 of FIG. 3) is provided through an input port (not shown) to a summation circuit 404. The summation circuit 404 outputs a signal 406 (analogous to value 304 of FIG. 3) to an accumulator circuit 408. The accumulator circuit 408 outputs a signal 410 (analogous to value 306) to a comparison circuit 412. The value used by the comparison circuit 412 may be a static reference value (e.g., 0 or 1) that may be hard coded. The comparison circuit 412 outputs a signal 414, which is the single-bit throttle signal 222 as well as a signal that controls a multiplexer 416. In particular, the multiplexer 416 outputs a signal 418 that is provided to the summation circuit 404. The summation circuit 404 also receives the signal 410.

Figure 5:
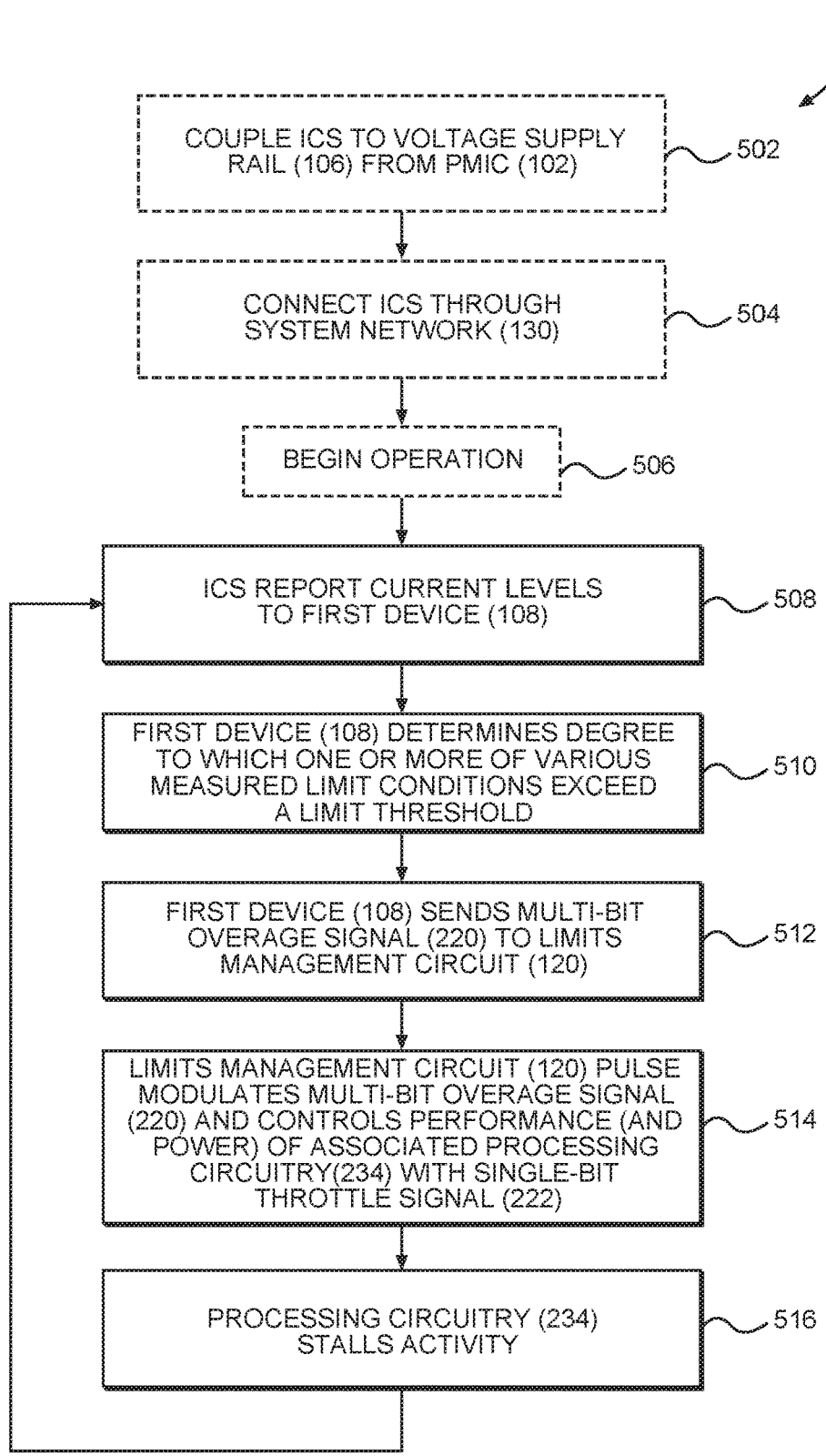
FIG. 5 is a flowchart illustrating an exemplary process for using a limits management circuit to create a single-bit throttle signal to modify internal processing of an IC, which in turn changes power consumption.

A flowchart of a process 500 according to an exemplary aspect of the present disclosure is provided in FIG. 5. The process 500 begins at construction when the various ICs are coupled to the voltage supply rail 106 from the PMIC 102 (block 502) in the computing device 100. The ICs are further connected through the system network 130 (block 504). Note that the communication link may be established before the power link without departing from the scope of the present disclosure. Operation of the computing device 100 begins (block 506). After operation begins, exemplary aspects of the present disclosure allow the limits management circuit 120 to throttle operation of associated processors to reduce power consumption within the computing device 100.

Thus, with continued reference to FIG. 5, the ICs report current levels to the first device 108 (block 508) over the system network 130. Additionally, a battery current level, a temperature, or other various limit condition measurements may be reported to the first device 108. Current levels may be sensed, inferred, or otherwise reported through DPMs, current sensors, or the like. The first device 108 determines a degree to which (if any) one or more of various measured limit conditions exceed a limit threshold (block 510) such as by using the over-limits table 212. As noted above, the first device 108 may include a summation circuit to determine the summed current level, and the threshold may be a maximum effective current level for the PMIC 102. Other possible limit conditions include current consumption by a single IC within the computing device 100, battery current levels, temperature, and the like.

The first device 108 sends a multi-bit overage signal 220 to one or more limits management circuits 120 (block 512) over the system network 130. The limits management circuit 120 pulse modulates the multi-bit overage signal 220 and controls performance (and thereby controls power consumption) of associated processing circuitry 234 with a single-bit throttle signal 222 (block 514). While there are many ways to pulse modulate, as noted above, an exemplary process is through a delta-sigma modulator, which outputs a single control bit. The processing circuitry 234 stalls activity (block 516), injects NOPs, or clock gates. The process 500 returns to current level reporting at block 508. Note that in practice, the current level reporting never stops and many of the steps may be taking place concurrently.

While the process 500 contemplates that the first device 108 has the over-limits table 212 and makes the determination in block 510 before sending the multi-bit overage signal 220 to a second IC (e.g., the processor 118) over the system network 130, it should be appreciated that the present disclosure is not so limited. Specifically, the over-limits table 212 may be within the same IC as the processing circuitry 234 that is being throttled. In such a situation, the multi-bit overage signal 220 does not need to pass through the system network 130, but may instead merely pass through an internal communication link within the IC as is well understood.

Other variations that are specifically contemplated as being within the scope of the present disclosure are variations in the difference calculation. For example, the accumulator circuit may subtract the input from the impulse (i.e., impulse-input) or the impulse from the input (input-impulse). In either case, the resulting value may then be integrated or accumulated. Comparisons made to the reference in the threshold circuit that is part of the delta-sigma modulator may use a greater than, less than, greater than or equal to, or less than or equal to the reference. Still further, an impulse injection is generated based on the range [min value, max value] (i.e., ranges from zero (0) to 255) of a multi-bit input based on the selector/compare result.

In an exemplary aspect, the reference values used in the delta-sigma modulator are static (e.g., zero, although any integer number can be chosen as a static reference value). However, this may lead to fairness issues. The single-bit output which is used as the throttle signal 222 to stall the processing circuitry 234 can result in the shared resource access pattern. As an example, the shared resource access pattern can result in a hardware thread access of a time shared or time-multiplexed resource being given more unfair share and opportunity to execute. This situation can result in other threads not having an opportunity to execute and thus are considered victimized. That is, the victim threads or processors are throttled more compared to the threads/processors obtaining more than their fair share of time to use the resources.

To avoid the potential for thread or processor starvation that may occur with a static reference value used in the delta-sigma circuitry as a reference, exemplary aspects of the present disclosure may add a random value into the process and apparatus in ICs in one or more of a variety of locations in the circuit to decrease the probability of thread or resource fairness issues in multi-threaded processors or multi-processor systems. The random number may be generated by any kind of random number generator (RNG) such as a linear feedback shift register (LFSR) that has a finite range.

Figure 6A:
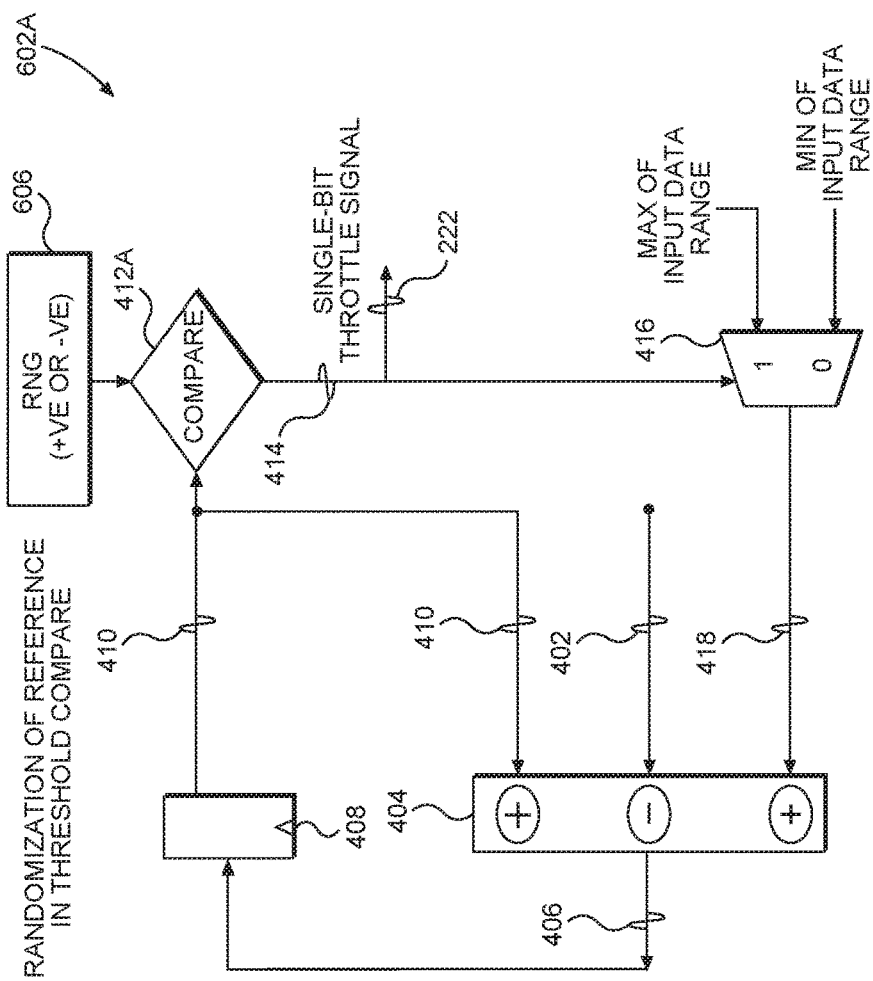
FIGS. 6A-6C are simplified abstract representations and simplified block diagrams of the circuits that may use a random value as part of pulse modulation to reduce likelihood of a multi-threaded processor's thread starvation due to unfair access to a shared resource or a multi-processor system's processor starvation due to unfair access for a processor.
Figure 6A:
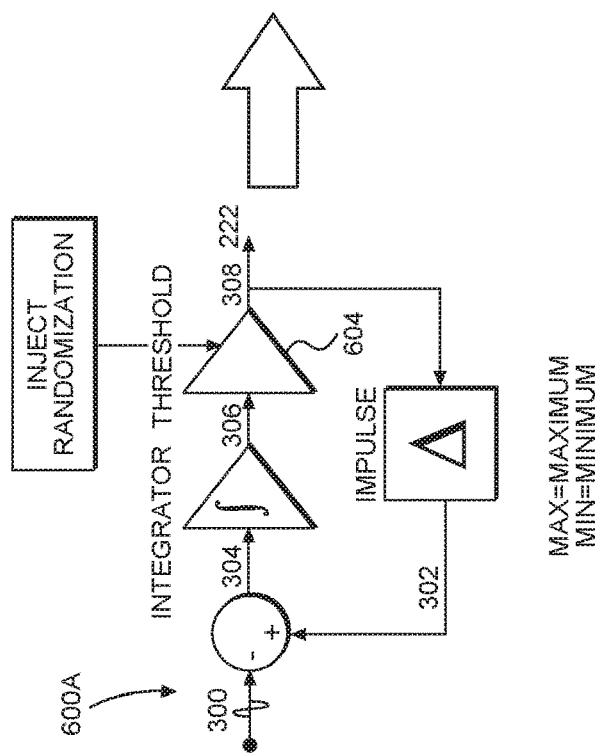
Figure 6B:
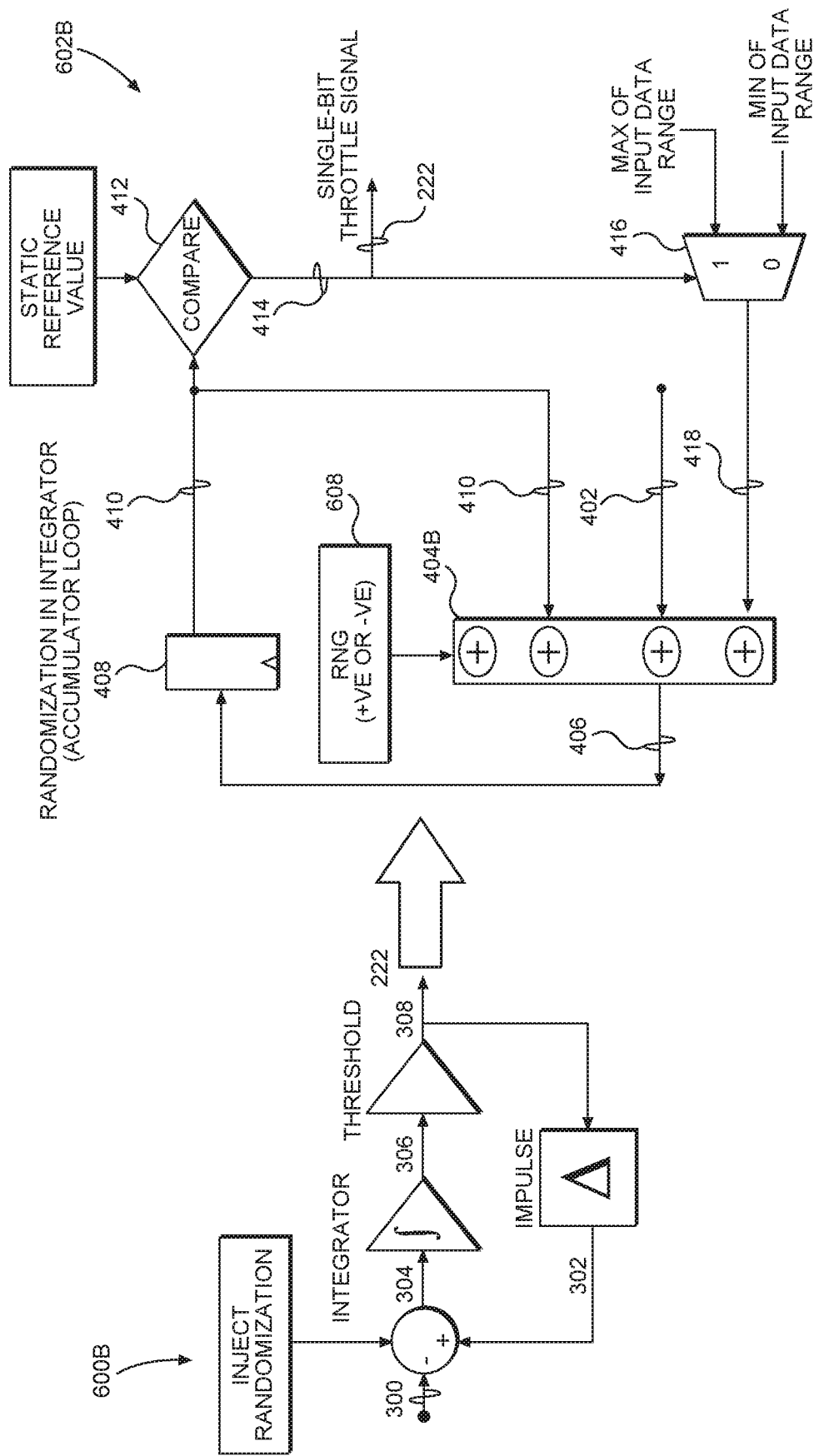
Figure 6C:
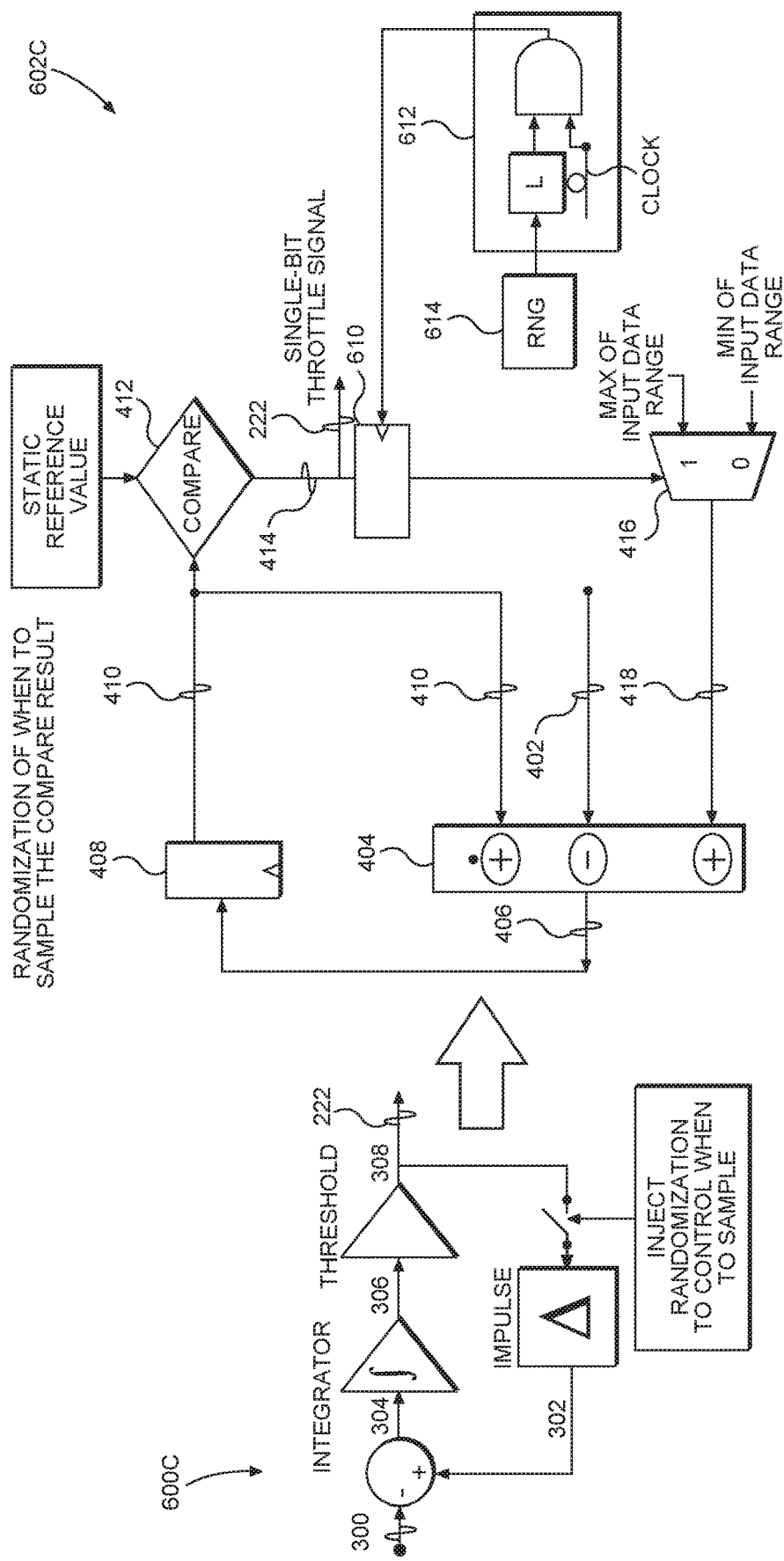

In this regard FIGS. 6A-6C illustrate simplified abstract and simple circuit diagrams reflecting exemplary ways in which the randomness may be introduced.

In particular, FIG. 6A shows an abstract diagram 600A of a circuit 602A similar to the abstraction of FIG. 3, but showing that randomization may be introduced at a threshold comparison block 604 and is used to generate the reference value. Thus, looking at a block diagram of the circuit 602A, many of the elements are the same as the limits management circuit 400 of FIG. 4, but a comparison circuit 412A receives a random value from a RNG circuit 606. Instead of continually comparing the signal 410 to a static reference value, the signal 410 is compared to this random number.

Alternatively, as shown in FIG. 6B, the randomization may be injected at the summation circuit in the abstract diagram 600B and, in the corresponding circuit 602B, the summation circuit 404B may receive a random number from an RNG circuit 608 that is added or subtracted to input value 402.

As still another alternative, as shown in the abstract diagram 600C in FIG. 6C, the randomization may be injected at the step of determining when to sample the generated threshold compare value that is eventually sent to select the impulse value. Thus, as seen in the circuit 602C, an RNG circuit 614 may output a signal that may be conditioned by a circuit 612 and used to clock a gate 610 in the path between the comparison circuit 412 and the multiplexer 416.

Figure 7:
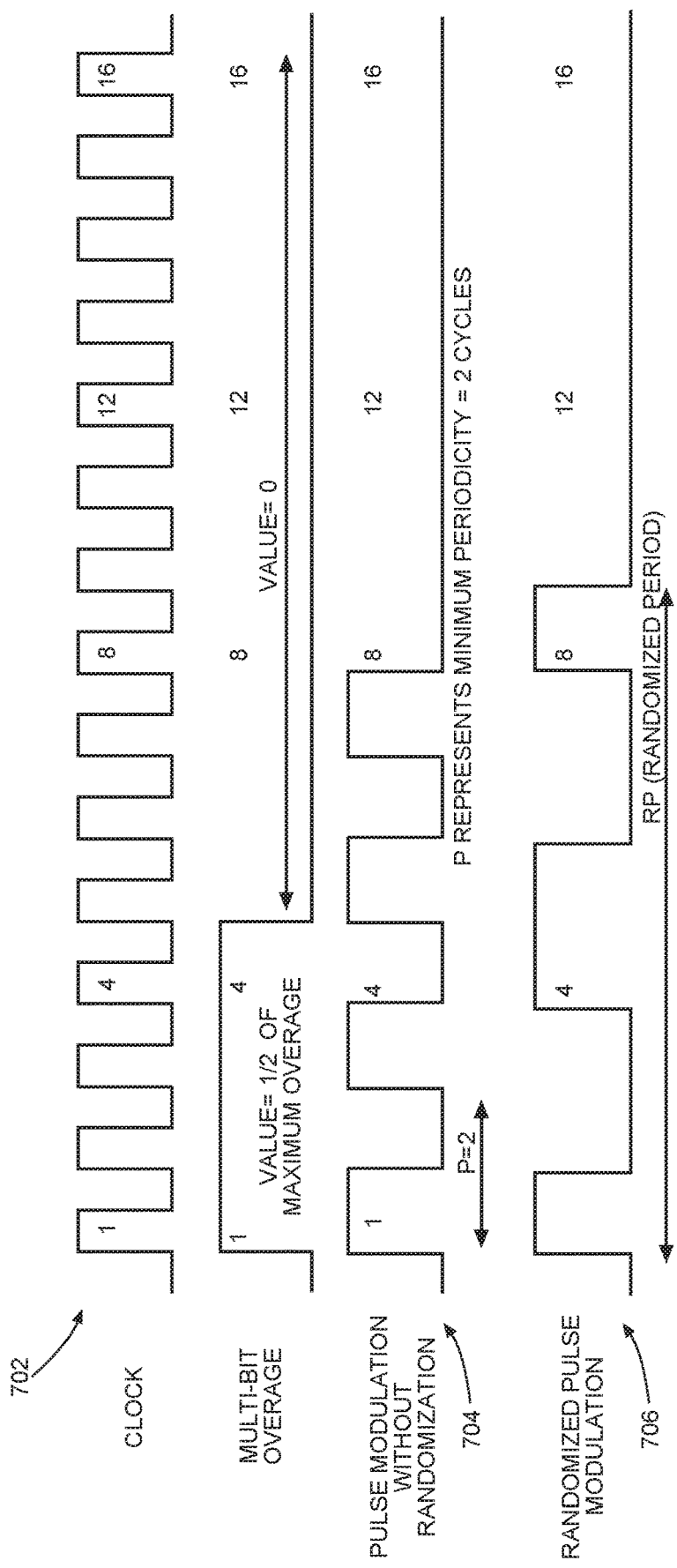
FIG. 7 is one of the possible results of use of a single-bit data stream after randomized pulse modulation of a multi-bit over-limits value of the IC for a multi-bit overage value that is equal to one-half of a maximum average.

The net result of such randomization is that the single bit is sent to the processing circuitry 234 of FIG. 2 and stalls the processing circuitry 234 at random times. As illustrated in FIG. 7, clock stream 702 shows an original clock signal. For a multi-bit overage value that is equal to one-half of maximum overage (i.e., 50% of maximum overage), data stream 704 shows a periodically stalled single-bit signal (e.g., analogous to what may be generated by the limits management circuit 120 but without any random injection in the pulse modulator), and data stream 706 shows a random single-bit signal such as may be generated by circuits 602A-602C incorporated in limits management circuit 120 with random injection in the pulse modulator.

Figure 8:
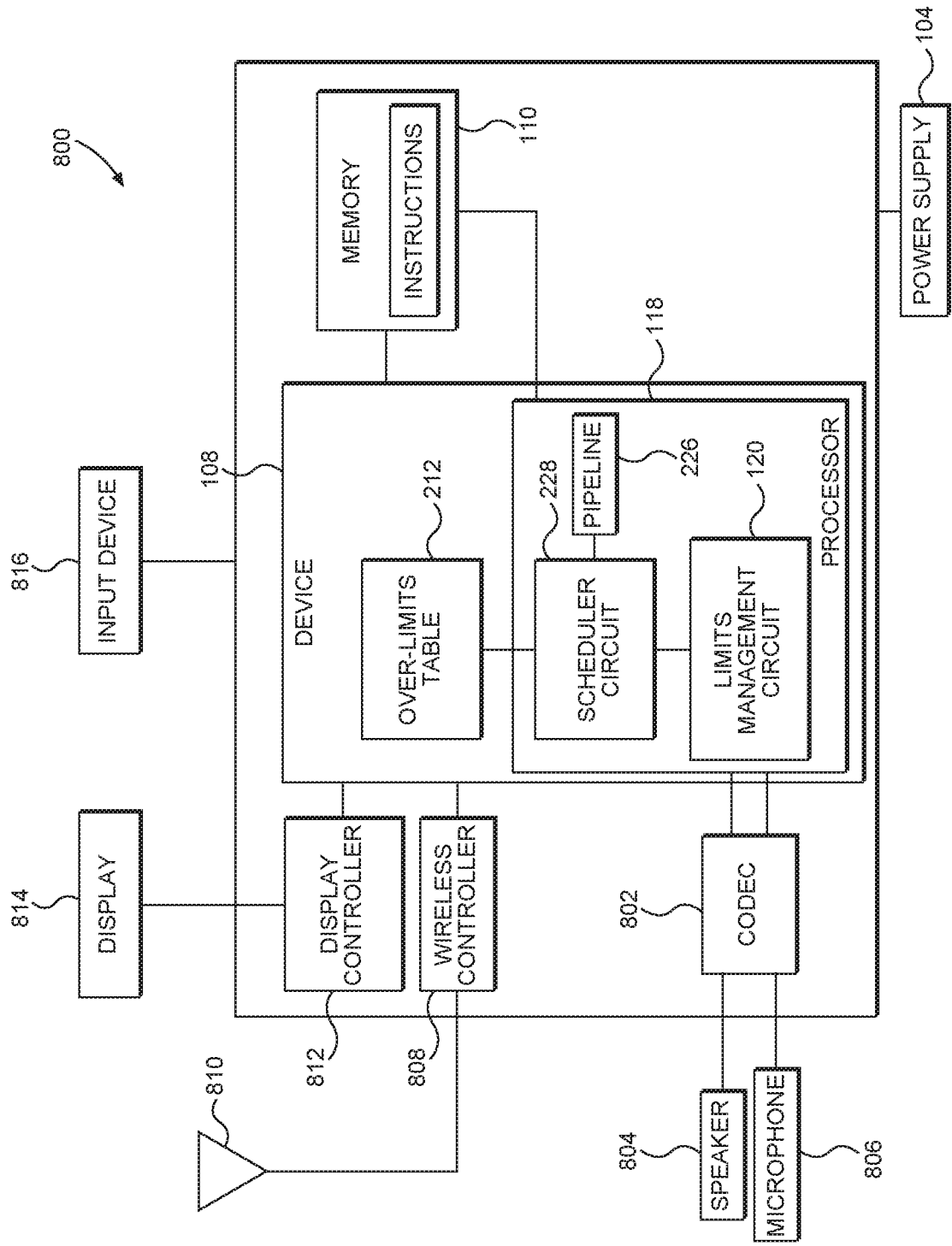
FIG. 8 is a simplified block diagram of a mobile computing device that may implement exemplary limits management circuits in one or more ICs to control performance.

FIG. 8 provides a simplified block diagram of a mobile device 800 that incorporates the limits management circuit 120. In particular, a first device 108 may include a processor 118 with an over-limits table 212 and communicate with the processor 118 that has a scheduler circuit 228, pipeline 226, and the limits management circuit 120. Memory 110 with instructions therein may be present and communicate with the first device 108 or the processor 118. Additional elements include a codec 802 that operates with a speaker 804 and microphone 806. Further, a wireless controller 808 may include a transceiver to send and receive signals over an antenna 810. A display controller 812 may control a display 814. Input devices 816 may include a touch screen, keyboard, or the like.

The systems and methods for power control based on performance modifications through pulse modulation according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art, Those of skill in the art will also understand that information and signals may be represented using any of a variety of different technologies and processes. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the genetic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) configured to be placed in a computing device, the IC comprising:
a limits management circuit comprising:
a pulse modulator circuit configured to convert a multi-bit overage signal to a single-bit throttle signal;
a random number generator (RNG) circuit coupled to the pulse modulator circuit; and
an output port configured to output the single-bit throttle signal; and
a processing circuit coupled to the output port and comprising a scheduler circuit configured to modify behavior of the processing circuit responsive to the single-bit throttle signal, wherein the scheduler circuit is configured to change performance based on the single-bit throttle signal.

2. The IC of claim 1, wherein the scheduler circuit is configured to stall or unstall a pipeline responsive to the single-bit throttle signal.

3. The IC of claim 1, wherein the scheduler circuit is configured to clock gate or clock ungate a pipeline responsive to the single-bit throttle signal.

4. The IC of claim 1, wherein the scheduler circuit is configured to reduce performance.

5. The IC of claim 1, wherein the scheduler circuit is configured to increase performance.

6. The IC of claim 1, wherein the RNG circuit is configured to provide a random value used by a summation circuit in the pulse modulator circuit.

7. The IC of claim 1, further comprising an over-limits table configured to generate the multi-bit overage signal.

8. A computing device comprising:
a first integrated circuit (IC), the first IC comprising:
a limits management circuit comprising:
a pulse modulator circuit configured to convert a multi-bit overage signal to a single-bit throttle signal; and
an output port configured to output the single-bit throttle signal; and
a processing circuit coupled to the output port and comprising a scheduler circuit configured to modify behavior of the processing circuit responsive to the single-bit throttle signal, wherein the scheduler circuit is configured to change performance of the processing circuit;
a second IC comprising:
memory configured to contain an over-limits table configured to contain configurable thresholds used to generate the multi-bit overage signal; and
a summation circuit configured to receive information indicative of per-device current consumption and sum the information, the summation circuit further configured to store the summed information in the over-limits table; and
one or more current sensors configured to provide a respective per-device current consumption signal to the summation circuit.

9. The computing device of claim 8, further comprising a temperature sensor configured to provide a temperature signal to the over-limits table.

10. The computing device of claim 8, wherein the one or more current sensors comprise one or more analog current sensors.

11. The computing device of claim 8, wherein the one or more current sensors comprise one or more digital power meters.

12. The computing device of claim 8, wherein the multi-bit overage signal is based on target performance and power and information indicating how much a measured value of a limit condition exceeds one of the configurable thresholds.

13. An integrated circuit (IC) configured to be placed in a computing device, the IC comprising:
a limits management circuit comprising:
an input port configured to receive a multi-bit overage signal;
a modulator coupled to the input port and configured to create a pulse modulated (PM) single-bit throttle signal;
a random number generator (RNG) circuit coupled to the modulator, and
an output port configured to output the PM single-bit throttle signal; and
a processing circuit configured to receive the PM single-bit throttle signal and stall operation based on the PM single-bit throttle signal.

14. The IC of claim 13, further comprising a local current sensor configured to provide a local current level to an over-limits table.

15. The IC of claim 13, wherein the RNG circuit is configured to generate a reference value used by the modulator.

16. The IC of claim 13 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method for modifying performance of an integrated circuit (IC), the method comprising:
receiving a multi-bit overage signal indicative of over-limit levels within a computing device;
pulse modulating the multi-bit overage signal to a single-bit throttle signal by using a random value in the pulse modulating; and
controlling a processing circuit in the IC to change performance of the processing circuit with the single-bit throttle signal.

18. The method of claim 17, wherein controlling the processing circuit comprises injecting a no-operation (NOP) code.

19. The method of claim 17, wherein using the random value in the pulse modulating modulation comprises injecting the random value when determining when to sample a compare value.

20. The method of claim 17, further comprising changing power consumption by varying the performance of the processing circuit.

21. The method of claim 17, further comprising creating fairness across threads in a multi-threaded processor in the computing device through randomized pulse modulation of the multi-bit overage signal.

22. The method of claim 21, further comprising creating fairness in accessing any shared resource in the computing device through randomized pulse modulation of the multi-bit overage signal.

23. The method of claim 17, further comprising creating fairness across processors in a multi-processor system in the computing device through randomized pulse modulation of the multi-bit overage signal.

24. The method of claim 17, wherein pulse modulating comprises using a delta-sigma modulator to pulse modulate.

25. The method of claim 24, wherein using the delta-sigma modulator comprises using a random number generator (RNG) circuit to inject a random number.

26. The method of claim 17, wherein pulse modulating comprises:
generating a difference between an input multi-bit signal with a generated impulse value;
generating the impulse value based on a selector; and
accumulating the difference using an integrator.

27. The method of claim 26, further comprising injecting the random value into the pulse modulating.

28. The method of claim 27, wherein injecting the random value comprises injecting the random value at an accumulator or at a sampling point.

29. The method of claim 17, wherein pulse modulating comprises using a comparison circuit to compare an input to a reference value.

30. The method of claim 29, further comprising generating the reference value using one of: a circuit producing a finite constant or a random number generator (RNG) circuit.

* * * * *